(12) United States Patent
Winters et al.

(10) Patent No.: US 6,461,434 B1
(45) Date of Patent: Oct. 8, 2002

(54) QUICK-CHANGE FLANGE

(75) Inventors: Toby John Winters, Austin, TX (US); Michael Patrick McFee, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/405,780

(22) Filed: Sep. 27, 1999

(51) Int. Cl.[7] ............... C23C 16/000; H01L 21/000
(52) U.S. Cl. .................................................. 118/715
(58) Field of Search ................... 118/715, 733; 156/345; 285/405, 410, 412; 277/590, 609, 649

(56) References Cited

U.S. PATENT DOCUMENTS

| | | | | |
|---|---|---|---|---|
| 4,255,098 A | * | 3/1981 | Hertell | 418/76 |
| 5,370,739 A | * | 12/1994 | Foster et al. | 118/725 |
| 5,415,384 A | * | 5/1995 | Obrist et al. | 269/309 |
| 5,511,760 A | * | 4/1996 | Kambara | 248/650 |
| 5,985,089 A | * | 11/1999 | Leibovich et al. | 156/345 |
| 6,007,634 A | * | 12/1999 | Weber et al. | 118/725 |
| 6,034,876 A | * | 3/2000 | Ohno et al. | 361/752 |
| 6,241,825 B1 | * | 6/2001 | Wytman | 118/733 |
| 6,263,621 B1 | * | 7/2001 | Murray et al. | 52/126.5 |

* cited by examiner

*Primary Examiner*—Gregory Mills
*Assistant Examiner*—Karla Moore
(74) *Attorney, Agent, or Firm*—Williams, Morgan & Amerson

(57) ABSTRACT

A processing tool is provided that has a reaction chamber, a base, a flange, and an adjuster. The flange is coupled between the reaction chamber and the base and may be used to quickly connect/disconnect the reaction chamber for maintenance. The flange has a first, second and third bore extending therein. The first bore opens onto a first surface thereof, and the second and third bores open onto a second surface thereof. The reaction chamber is mounted to the flange via a first connector extending into the first opening, and the base is mounted to the flange via a second connector extending into the second opening. At least the second surface of said flange is accessible with the reaction chamber, base and flange in an assembled configuration. The adjuster extends through the base and into the third bore in the flange. The adjuster is adapted to cause movement of the flange in first and second opposite directions in response to movement thereof.

10 Claims, 3 Drawing Sheets

QUICK-CHANGE FLANGE

BACKGROUND OF THE INVENTION

1. Field of the Invention

This invention relates generally to the field of semiconductor manufacturing, and, more particularly, to a method and apparatus for quickly and efficiently removing and replacing a reaction chamber in a semiconductor processing tool.

2. Description of the Related Art

In the manufacture of semiconductor devices, wafers, such as silicon wafers, are subjected to a number of processing steps. The processing steps include depositing or forming layers, patterning the layers, and removing portions of the layers to define features on the wafer. One such process step is the formation of a layer by chemical vapor deposition, where reactive gases are introduced into a vessel containing the semiconductor wafers. The reactive gases facilitate a chemical reaction that causes a layer to form on the wafers.

Certain chemical reactions produce byproducts in addition to the desired material forming the layer. Some of these byproducts vaporize at the elevated processing temperatures at which the deposition process operates, and absorb into the forming layer, causing small particle defects in the film. As subsequent lots of wafers are processed, the concentration of the byproducts increases, causing a corresponding upward trend in the defect level on the wafers.

This increasing defect level may be monitored by known statistical process control techniques. When the defect level reaches a certain level, the processing tool is disassembled and cleaned to remove the byproduct materials, thus maintaining the defect density at acceptable levels.

An exemplary processing tool susceptible to byproduct production is a low-pressure chemical vapor deposition (LPCVD) system used to deposit a silicon nitride $Si_3N_4$ layer. Silicon nitride layers are commonly used as passivation, masking, or insulating layers. In the LPCVD system, dichlorosilane ($SiH_2Cl_2$) is combined with ammonia ($NH_4$) to facilitate the chemical reaction that results in the deposition of the silicon nitride layer. An ammonium chloride ($NH_4Cl$) byproduct forms and builds up on the internal surfaces of the processing chamber. As nitride layers are formed on subsequent lots of wafers, the ammonium chloride deposits as particle defects within the silicon nitride layers. When the defect count reaches a predetermined level, the LPCVD tool is disassembled and cleaned.

Typically, the disassembly, cleaning, and re-assembly process takes at least 24 hours. The maintenance procedure is generally conducted after between 20 and 30 processing runs. The significant down time required to complete the cleaning procedure affects the production efficiency of the tool and the overall facility.

The present invention is directed to overcoming, or at least reducing the effects of, one or more of the problems set forth above.

SUMMARY OF THE INVENTION

In one aspect of the present invention a processing tool is provided. The processing tool includes a reaction chamber, a base, and a flange. The flange is coupled between the reaction chamber and the base. The flange has a first and second bore extending therein, such that the first and second bores open onto first and second opposite surfaces thereof. The reaction chamber is mounted to the flange via a first connector extending into the first opening. The base is mounted to the flange via a second connector extending into the second opening. At least the second surface of the flange is accessible with the reaction chamber, base and flange being in an assembled configuration.

BRIEF DESCRIPTION OF THE DRAWINGS

The invention may be understood by reference to the following description taken in conjunction with the accompanying drawings, in which like reference numerals identify like elements, and in which.

Figure 1:
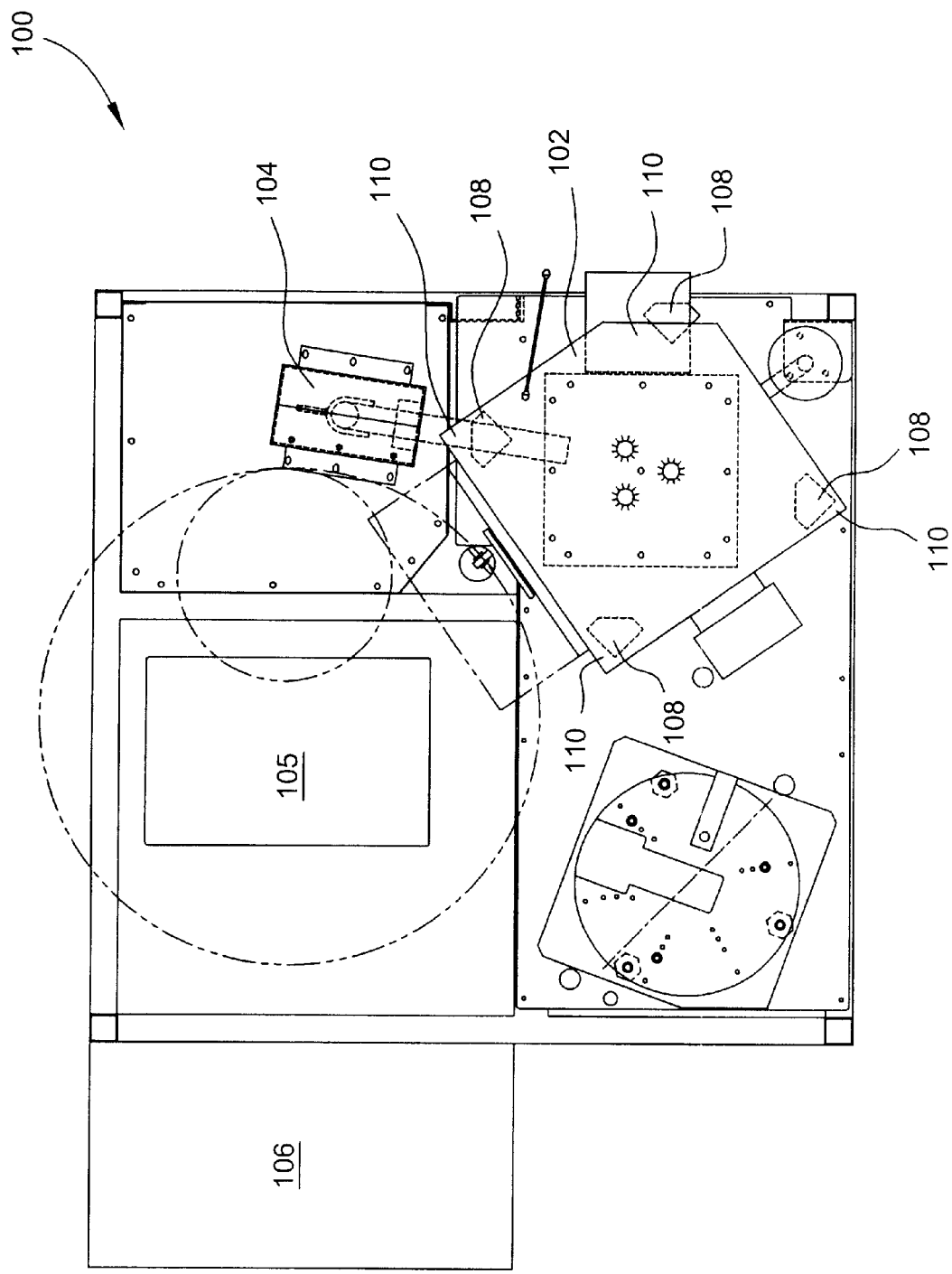
FIG. 1 is a top view of a semiconductor processing tool.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Referring now to the figures, and in particular, to FIG. 1, a simplified diagram of a processing tool 100 is provided. In the illustrated embodiment, the processing tool 100 is a Downstream Plasma Resist Stripper, such as model No. L3500, manufactured by Gasonics, Inc. Although the invention is described as it may be implemented in a Plasma Stripper tool, it is contemplated that the concepts described herein may be applied to various other processing tools, related or not related to semiconductor fabrication, wherein the processing of a given article would benefit from quick and efficient assembly/disassembly and positioning.

The processing tool 100 includes, among other things, a reaction chamber 102, a plasma tube 104 a robot 105, and a queue 106. Lots of wafers (not shown) intended to be processed by the tool 100 are placed in the queue 106 by either an automated wafer handling system (not shown) or a manual wafer handling system. Once the wafers have been placed in the queue 106, the robot 105, under computer control, transports the wafers between the queue 106 and the reaction chamber 102. Thus, precise positioning of the reaction chamber 102 relative to the robot 105 is useful to insure that the robot 105 accurately places/retrieves the wafers in/from the reaction chamber 102.

The reaction chamber 102 is supported and positioned by a plurality of flanges 108. In the illustrated embodiment, four flanges are used, but more or fewer flanges 108 may be used, depending upon the configuration of the processing tool 100 and reaction chamber 102. The flanges 108 are located near the four corner areas 110 of the reaction chamber 102, and are accessible from below so that the position of the reaction chamber 102 may be adjusted, or the reaction chamber 102 may be removed without disassembly of the reaction chamber 102, as was required by the prior art. Since the reaction chamber 102 may be removed as a whole unit, it is possible to quickly remove the reaction chamber 102 when maintenance is required, and, if desired, quickly position a new reaction chamber 102 in the processing tool 100. This quick-change feature allows the semiconductor-processing tool 100 to be quickly returned to service without substantially interrupting processing.

Figure 2A:
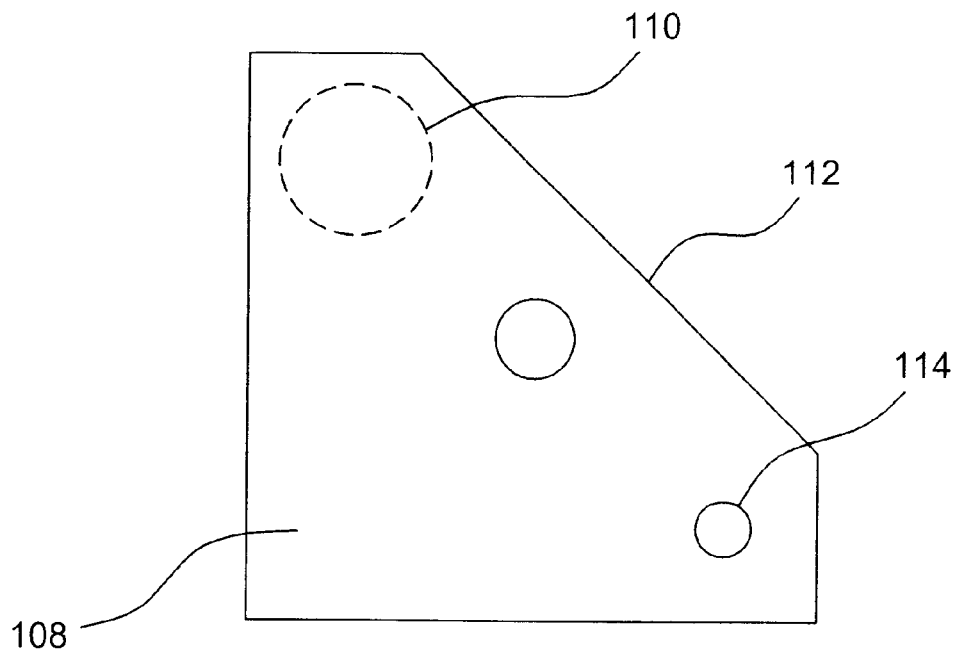
FIGS. 2A and 2B show a top and side view respectively of a flange of FIG. 1.
Figure 2B:
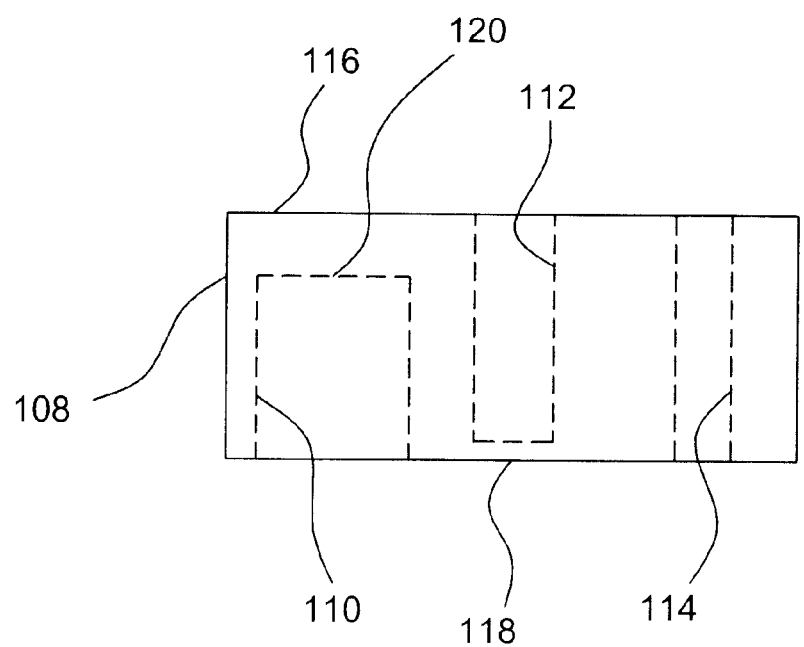

Turning now to FIGS. 2A and 2B, a top and side view of the flange 108 are shown, respectively. The flange 108 is generally triangular in configuration and has three bores 110, 112, 114 extending therein. The bores 110, 112 are blind bores, extending only partially through the flange 108 from opposite sides 116, 118 thereof. The first blind bore 110 has a bottom surface 120 that may be engaged by an adjuster 122 (see FIG. 3) to provide for controlled vertical movement of the flange 108 and reaction chamber 102. The second blind bore 112 is threaded to engagingly receive a bolt or screw therein for mounting the reaction chamber 102 to the flange 108. It is envisioned that the second blind bore 112 need not stop within the flange 108, but may extend entirely therethrough. The third bore 114 extends entirely through the flange 108 and is also threaded to engagingly receive a bolt or screw therein for mounting the flange 108 to a base 124 (see FIG. 3). It is envisioned that the third bore 114 need not extend entirely through the flange 108, but could extend only partially therethrough, opening onto the lower surface 118 of the flange 108.

Figure 3:
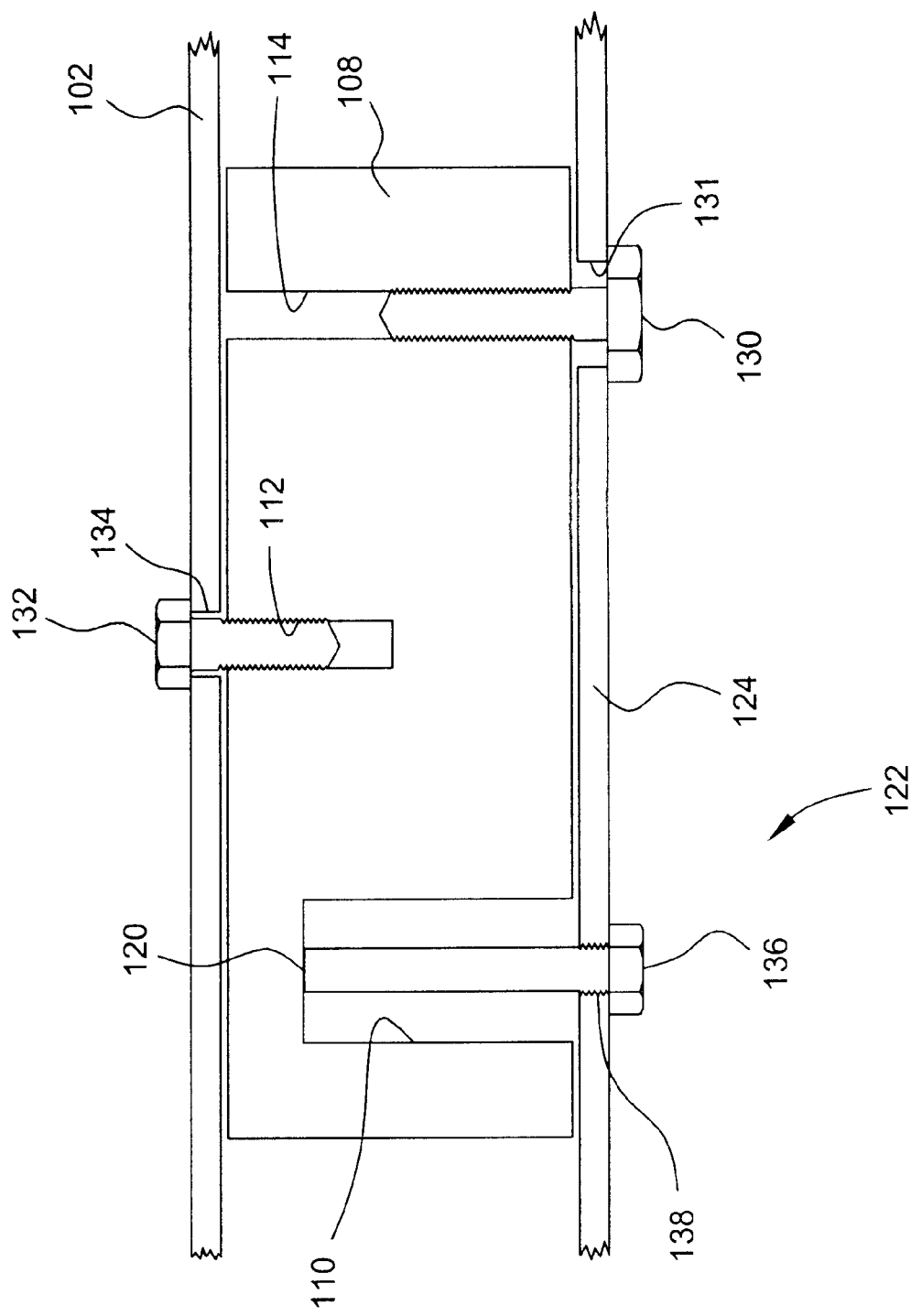
FIG. 3 is a side view of the semiconductor processing tool of FIG. 1.

Turning now to FIG. 3, a side view of the flange 108 assembled with the reaction chamber 102 is shown. The flange 108 is mounted to a base 124 via a bolt 130 extending into and threadably engaged with the third base 114. The base 124 has an enlarged or elongated opening 131 extending therethrough and receiving the bolt 130 therein. The enlarged opening 131 allows for movement of the bolt 130, and thus the flange 108 and reaction chamber 102 in X and Y directions. Movement in the X and Y directions allows the reaction chamber 102 to be precisely positioned relative to the robot 105 so that wafers may be accurately positioned in the reaction chamber 102.

The reaction chamber 102 is mounted to the flange 108 via a bolt 132 extending into and threadably engaged with the second base 112. The bolt 132 passes through an opening 134 in the reaction chamber 102 to form an assembled unit with the flange 108. That is, the reaction chamber 102 and flange 108 are first assembled together as a unit, and then mounted on the base 124. Thus, disassembly begins with the reaction chamber 102 and flange 108 being removed as a unit. Removing the bolt 130 frees the reaction chamber 102 and flange 108 to be removed and then replaced as a unit without disassembly of the reaction chamber 102.

Adjustment of the reaction chamber 102 in the Z direction is effected by the adjuster 22, which includes a bolt 136 extending through a threaded opening 138 in the base 124. The bolt 136 does not threadably engage the flange 108, but rather, pushes against the bottom surface 120 of the blind bore 110. Threading the bolt 136 into the bore 110 causes the bolt to push against the bottom surface 120 of the blind bore 110 and urge the flange 108 and reaction chamber 102 in the positive Z direction. Alternatively, unthreading the bolt 136 out of the bore 110 causes the bolt to lower the flange 108 and reaction chamber 102 in the negative Z direction. Adjusting the bolt 136 in each of the flanges 108 at each corner 110 of the reaction chamber 102 allows the chamber to be leveled, reducing semiconductor processing effects, such as drift. The diameter of the bore 110 is selected to be substantially larger than the bore of the bolt 136 so that adjustment of the flange 108 in the X and Y will not be interfered with by the bolt 136 engaging the side walls of the bore 110.

Finally, it should be noted that the bolts 130 used to attach the flange 108 and reaction chamber 102 to the base 124 are accessible from below so that the reaction chamber 102 may be released and removed for maintenance without the need for substantial disassembly of the reaction chamber 102. Likewise, the bolts 136 used to control the Z axis of the reaction chamber 102 are also accessible from below to allow for fine adjustments of the reaction chamber 102 without the need for substantial disassembly of the reaction chamber 102.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A processing tool, comprising:

a reaction chamber;

a base; and a flange coupled between said reaction chamber and said base, said flange having a first and second bore extending therein, said first and second bores opening onto first and second opposite surfaces thereof, said reaction chamber being mounted to said flange via a first connector extending into said first bore, and said base being mounted to said flange via a second connector extending into said second bore, at least said second surface of said flange being accessible with said reaction chamber, base and flange being in an assembled configuration.

2. A processing tool, as set forth in claim 1, wherein said base has an opening formed therein to receive the second connector therethrough, said opening having a first preselected diameter, and said second connector having a second preselected diameter, said first preselected diameter being substantially larger than said second preselected diameter.

3. A processing tool, as set forth in claim 1, wherein said first and second connectors are bolts and said first and second bores are threaded.

4. A processing tool, as set forth in claim 1, including a third bore extending partially into said flange and opening onto said second surface, and a bolt extending through a threaded opening in said base and into said third bore, said bolt engaging said third bore to cause movement of said flange in a first and second direction in response to rotation of said bolt in a first and second direction, respectively.

5. A processing tool, as set forth in claim 4, wherein said third bore has a first diameter and said bolt has a second diameter, said first diameter being substantially larger than said second diameter.

6. A processing tool, comprising:

a reaction chamber;

a base;

a flange coupled between said reaction chamber and said base, said flange having a first, second and third bore extending therein, said first bore opening onto a first surfaces thereof, and said second and third bores opening onto a second surface thereof, said reaction chamber being mounted to said flange via a first connector extending into said first bore, and said base being mounted to said flange via a second connector extending into said second bore, at least said second surface of said flange being accessible with said reaction chamber, base and flange being in an assembled configuration; and an adjuster extending through said base and into said third bore in said flange, said adjuster being adapted to cause movement of said flange in first and second opposite directions in response to movement thereof.

7. A processing tool, as set forth in claim 6, wherein said base has an opening formed therein to receive the second connector therethrough, said opening having a first preselected diameter, and said second connector having a second preselected diameter, said first preselected diameter being substantially larger than said second preselected diameter.

8. A processing tool, as set forth in claim 6, wherein said first and second connectors are bolts and said first and second bores are threaded.

9. A processing tool, as set forth in claim 6, wherein said adjuster includes a bolt extending through a threaded opening in said base and into said third bore, said bolt engaging said third bore to cause movement of said flange in a first and second direction in response to rotation of said bolt in a first and second direction, respectively.

10. A processing tool, as set forth in claim 9, wherein said third bore has a first diameter and said bolt has a second diameter, said first diameter being substantially larger than said second diameter.

* * * * *